(12) United States Patent
Takeda et al.

(10) Patent No.: US 8,231,934 B2
(45) Date of Patent: Jul. 31, 2012

(54) CONDUCTIVE PASTE FOR SOLAR CELL ELECTRODE

(75) Inventors: Norihiko Takeda, Kanagawa (JP); Takuya Konno, Tochigi-Ken (JP)

(73) Assignee: E. I. du Pont de Nemours and Company, Wilmington, DE (US)

( * ) Notice: Subject to any disclaimer, the term of this patent is extended or adjusted under 35 U.S.C. 154(b) by 364 days.

(21) Appl. No.: 12/621,729

(22) Filed: Nov. 19, 2009

(65) Prior Publication Data

US 2010/0126565 A1    May 27, 2010

Related U.S. Application Data

(60) Provisional application No. 61/118,016, filed on Nov. 26, 2008.

(51) Int. Cl.
*B05D 5/12* (2006.01)
*H01L 31/0224* (2006.01)
*H01B 1/08* (2006.01)

(52) U.S. Cl. ..... 427/123; 252/512; 252/514; 252/518.1; 136/256

(58) Field of Classification Search ................. 427/96.1, 427/123–125; 136/252–256
See application file for complete search history.

(56) References Cited

U.S. PATENT DOCUMENTS

| 5,176,853 | A | 1/1993 | Sarma et al. |
| 2006/0102228 | A1 | 5/2006 | Sridharan et al. |
| 2006/0273287 | A1 * | 12/2006 | Young et al. ................... 252/500 |
| 2009/0120490 | A1 * | 5/2009 | Huang et al. ................... 136/252 |
| 2010/0096598 | A1 * | 4/2010 | Sridharan et al. ............. 252/514 |

FOREIGN PATENT DOCUMENTS

| EP | 0474879 A1 | 3/1992 |
| EP | 1713091 A2 | 10/2006 |
| JP | H11-329070 | 11/1999 |
| JP | 2001-127317 | 5/2001 |
| JP | 2001-313400 | 11/2001 |
| JP | 2008-042095 | 2/2008 |
| JP | 2008-109016 | 5/2008 |
| WO | 2009/052349 A1 | 4/2009 |

OTHER PUBLICATIONS

International Search Report for International Application No. PCT/US2009/065646 Dated Feb. 15, 2010.

* cited by examiner

*Primary Examiner* — Mark Kopec

(57) ABSTRACT

To obtain low resistance and high adhesion at the same time in a solar cell electrode, a conductive paste is offered. A conductive paste for solar cell electrode contains conductive powder, organic medium and glass frit which is mixture of more than one kind of glass frit such as a mixture of glass frit containing at least PbO and glass frit containing at least $Bi_2O_3$.

8 Claims, 2 Drawing Sheets

CONDUCTIVE PASTE FOR SOLAR CELL ELECTRODE

FIELD OF THE INVENTION

This invention relates to a conductive paste for solar cell electrode and a method for its production.

BACKGROUND OF THE INVENTION

One of the most terrestrial electric power-generating solar cells currently are silicon solar cells. Process flow in mass production is generally aimed at achieving maximum simplification and minimizing manufacturing costs. Electrodes in particular are made by using a method such as screen printing to form a metal paste. An example of this method of production is described in the following with FIG. 1. The present invention is adaptable not only to the example shown as FIG. 1 but also to the n-base type or back-contact type solar cell.

FIG. 1A shows a p-type silicon substrate, 10.

In FIG. 1B, an n-type diffusion layer, 20, of the reverse conductivity type is formed by the thermal diffusion of phosphorus (P) or the like. Phosphorus oxychloride ($POCl_3$) is commonly used as the phosphorus diffusion source. In the absence of any particular modification, the diffusion layer, 20, is formed over the entire surface of the silicon substrate, 10. This diffusion layer typically has a sheet resistivity on the order of several tens of ohms per square, and a thickness of about 0.3 to 0.5 μm.

After protecting one surface of this diffusion layer with a resist or the like, as shown in FIG. 1C, the diffusion layer, 20, is removed from most surfaces by etching so that it remains only on one main surface. The resist is then removed using an organic solvent or the like.

Next, a silicon nitride film, 30, is formed as an anti-reflection coating on the n-type diffusion layer, 20, to a thickness of typically about 700 to 900 Å in the manner shown in FIG. 1D by a process such as plasma chemical vapor deposition (CVD).

As shown in FIG. 1E, a silver paste, 50, for the front electrode is screen printed then dried over the silicon nitride film, 30. In addition, a backside silver or silver/aluminum paste, 70, and an aluminum paste, 60, are then screen printed and successively dried on the backside of the substrate. Firing is then carried out in a furnace at a temperature of approximately less than 1000° C. for several seconds or for several minutes.

Consequently, as shown in FIG. 1F, aluminum diffuses from the aluminum paste into the silicon substrate, 10, as a dopant during firing, forming a p+ layer, 40, containing a high concentration of aluminum dopant. This layer is generally called the back surface field (BSF) layer, and helps to improve the energy conversion efficiency of the solar cell.

The aluminum paste is transformed by firing from a dried state, 60, to an aluminum back electrode, 61. The backside silver or silver/aluminum paste, 70, is fired at the same time, becoming a silver or silver/aluminum back electrode, 71. During firing, the boundary between the back side aluminum and the back side silver or silver/aluminum assumes an alloy state, and is connected electrically as well. The aluminum electrode accounts for most areas of the back electrode, owing in part to the need to form a p+ layer, 40. Because soldering to an aluminum electrode is impossible, a silver back electrode is formed over portions of the back side as an electrode for interconnecting solar cells by means of copper ribbon or the like. In addition, the front electrode-forming silver paste, 50, sinters and penetrates through the silicon nitride film, 30, during firing, and is thereby able to electrically contact the n-type layer, 20. This type of process is generally called "fire through". This fired through state is apparent in layer 51 of FIG. 1F.

Glass frit is added to the conductive paste used in silicon solar cells such as the above to obtain sufficient adhesive strength on the substrate even when the firing time is short, and conductive pastes in which conductive metallic powders such as silver, glass frit (glass frit), and various additives are dispersed in an organic vehicle are usually used. Further, an insulating protective film is sometimes formed on the surface of semiconductor substrates in solar cells, and a conductive paste in which glass frit is added is used also as the conductive paste used on the protective film, so that the insulating protective film is dissolved away during firing. However, there is a problem in that such glass frits often soften and flow during the firing process and become segregated in the interface between the substrate and electrode, resulting in the formation of an insulating layer, which increases electrode resistance. To avoid this problem, the amount of glass frit that is added may be lowered or the firing temperature may be lowered, but these options may lead to reduced adhesive strength between the electrode and conductor substrate or between the electrode and solder. The insulating protective film could be insufficiently dissolved away during firing. There is a trade off between decreasing the electrical resistance and increasing the adhesive strength, and a resulting conventional problem is a difficulty of multaneously bringing about low resistance and high adhesive strength. Recently, shallow-emitter type solar cells with shallow layers on the light-receiving side have been attracting attention, with the promise of superior wafer properties, but as ensuring both the conductivity and adhesion of electrodes is even more difficult in this type, there is a need for electrodes endowed with both lower resistance and higher adhesive strength. The following means have been proposed for solving these problems relating to electrodes for solar cells.

JP2001-313400; discloses how to solve adhesion and resistance problem in a solar cell electrode. The electrode material includes one or more powders from among titanium, bismuth, cobalt, zinc, zirconium, iron, and chromium or its oxides.

JP2001-127317 discloses conductive paste containing two kinds of glass frit which have low softing point glass frit and high softing point glass frit in order to obtain an electrode with strong adhesion.

JP2008-109016 discloses glass composision in a conductive paste which gives strong adhesion between Si wafer and an electrode. The glass composition comprises 5 wt % to 10 wt % of ZnO, 70 wt % to 84 wt % of Bi2O3, more than 6 wt % of $B_2O_3$ plus $SiO_2$.

JP2008-042095 discloses a multilayer structure of electrode to enable sufficient adhesion between the Si wafer, the electrode and solder. The lower layer attaching to the Si wafer contains one or more than two of Ti, Bi, Zr, V, Nb, Ta, Cr, Mo, W, Mn, Fe, Co, Ni, Si, Al, Ge, Sn, Pb, Zn as an additive.

JPH11-329070 discloses conductive paste which is capable of reliably forming an electrode having a low contact resistance and strong adhesion. The conductive paste contains crystalline composite oxide. There is a need for conductive pastes with low resistance and high adhesion to electrode surfaces.

SUMMARY OF THE INVENTION

The present invention is a conductive paste for a solar cell electrode which has low resistance and high adhesion at the same time. A conductive paste for solar cell electrode of this present invention comprises conductive powder, organic medium and glass frit which comprises 20 wt %-80 wt % of glass containing at least PbO and 80 wt %-20 wt % of glass containing at least Bi2O3. The glass frit preferably comprises one or more of $SiO_2$, $Al_2O_3$ and $B_2O_3$. And the total content of $SiO_2$, $Al_2O_3$, and $B_2O_3$ in glass containing at least PbO is preferably 11 to 70 wt % and the total content of $SiO_2$, $Al_2O_3$, and $B_2O_3$ in glass containing at least $Bi_2O_3$ is preferably 11 to 70 wt %. The amount of the glass frit is from 0.5 to 12.0 wt % of the conductive paste.

The present invention also relates to a method for producing a solar cell electrode. The method for producing a solar cell electrode comprises steps of applying a conductive paste on a silicon wafer, wherein the conductive paste comprises conductive powder, organic medium and glass frit which comprises 20 wt %-80 wt % of glass containing at least PbO and 80 wt %-20 wt % of glass containing at least Bi2O3; and firing the applied conductive paste.

DETAILED DESCRIPTION OF THE INVENTION

Figure 1A:
FIG. 1 is a process flow diagram illustrating the fabrication of an electrode solar cell.

The main components of the paste from which the electrode is made are electrically functional conductive powder, glass frit and organic medium. The components are discussed herein below.

(1) Electrically Functional Conductive Powders

Generally, a thick film composition comprises a functional phase that imparts appropriate electrically functional properties to the composition. The functional phase comprises electrically functional powders dispersed in an organic medium that acts as a carrier for the functional phase that forms the composition. The composition is fired to burn out the organic phase, activate the inorganic binder phase and to impart the electrically functional properties.

The functional phase of the composition may preferably be coated or uncoated silver particles which are electrically conductive. When the silver particles are coated, they may be partially coated with a surfactant. The surfactant may be selected from, but is not limited to, stearic acid, palmitic acid, a salt of stearate, a salt of palmitate and mixtures thereof. Other surfactants may be utilized including lauric acid, palmitic acid, oleic acid, stearic acid, capric acid, myristic acid and linolic acid. The counter-ion can be, but is not limited to, hydrogen, ammonium, sodium, potassium and mixtures thereof.

The particle shape of the conductive powder can be spherical or flake type. It is not especially limited in this present invention, however, conductive powder can be preferably a mixture of spherical conductive powder and flake conductive powder. The content of spherical conductive powder is 20-80 wt % of the total conductive powder. The content of flake silver powder is 20-80 wt % of the total conductive powder.

The particle size of the conductive powder is not subject to any particular limitation, although an average particle size [d50] of no more than 10 μm, and preferably no more than 3 μm, is desirable. The conductive powder accounts for, but not limited to, 70 to 99 wt % of the conductive paste.

Electrically functional conductive powders can include one or more of metal powder(s) selected from the group consisting of Pd, Ir, Cu, Ni, Al, Au, Su, Zn, Pt, Ru, Ti, and Co. The metal powder(s) is preferably used with silver. These conductive powders, especially Pd, are effective on decrease of Ag migration. These conductive powders might be preferably mixture of silver and the metal powder, it might be preferably silver particle coated with these metal.

(2) Glass Frit

The present invention is a conductive paste comprising a glass frit containing at least PbO and a glass frit containing at least $Bi_2O_3$. The amount of PbO in glass containing at least PbO is preferably 20 to 70 wt %, more preferably 40 to 65 wt % of the glass frit. The amount of $Bi_2O_3$ in Glass containing at least Bi2O3 is preferably 20 to 75 wt %, more preferably 40 to 70 wt % of the glass frit. The ideal glass frit is a mixture of glass containing at least PbO and no $Bi_2O_3$, and glass containing at least $Bi_2O_3$ and no PbO. However, the composition of glass containing at least PbO may include $Bi_2O_3$. The PbO and $Bi_2O_3$ weight ratio in such cases is preferably PbO/$Bi_2O_3$>2. Within this range, glass frit comprising a mixture of glass containing at least $Bi_2O_3$ with glass containing a small amount of $Bi_2O_3$ and relatively large amount of PbO may be used. The composition of glass containing at least $Bi_2O_3$ may include PbO, but the $Bi_2O_3$ and PbO weight ratio in such cases is preferably $Bi_2O_3$/PbO>2. Within this range, glass frit comprising a mixture of glass containing at least PbO with glass containing a small amount of PbO and relatively large amount of $Bi_2O_3$ may be used. A glass frit comprising a mixture of a glass containing a small amount of $Bi_2O_3$ and relatively large amount of PbO and a glass containing a small amount of PbO and relatively large amount of $Bi_2O_3$ may also be used. In this case, the $Bi_2O_3$ and PbO weight ratio of the former glass composition is preferably PbO/$Bi_2O_3$>2, and the $Bi_2O_3$ and PbO weight ratio of the latter glass composition is preferably $Bi_2O_3$/PbO>2.

Other glass composition components will be described next. Both glass containing at least PbO and glass containing at least $Bi_2O_3$ preferably further include one or more oxides from $SiO_2$, $Al_2O_3$, and $B_2O_3$ as glass formers in addition to PbO and $Bi_2O_3$. The total content of $SiO_2$, $Al_2O_3$, and $B_2O_3$ in glass containing at least PbO is preferably 11 to 70 wt %, and more preferably 25 to 56 wt %. The total content of $SiO_2$, $Al_2O_3$, and $B_2O_3$ in glass containing at least $Bi_2O_3$ is preferably 11 to 70 wt %, and more preferably 25 to 56 wt %. In both glasses, the preferred content of each of $SiO_2$, $Al_2O_3$, and $B_2O_3$ is given below. The amount of $SiO_2$ in glass containing at least PbO or glass containing at least Bi2O3 is more preferably 10 to 40 wt %, more preferably 20 to 35 wt %. The amount of $Al_2O_3$ in glass containing at least PbO or Glass containing at least Bi2O3 is more preferably 0.01 to 13 wt %, more preferably 2 to 9 wt %. The amount of $B_2O_3$ in Glass containing at least PbO or glass containing at least Bi2O3 is more preferably 1 to 17 wt %, more preferably 3 to 12 wt %. $P_2O_5$ could be contained as well as a glass former, although $P_2O_5$ is generally not often used. In case of using $P_2O_5$, the amount of $P_2O_5$ is preferably 30 to 80 wt %. Glass containing at least PbO and glass containing at least $Bi_2O_3$ might contain more preferably further one or more than two oxide(s) selected from a group consisting of TiO2, ZrO2, Na2O, Li2O, CaO, CeO, BaO, MgO, K2O CuO, AgO.

The containing proportion of glass containing at least PbO and glass containing at least Bi2O3 is described here. The present invention offers an conductive paste for solar cell electrode which obtains both of low $R_S$ and strong Ad at the same time by using the two kinds of glass frit of glass containing at least PbO and glass containing at least $Bi_2O_3$. As shown in the following example section, proper presence of glass containing at least PbO and glass containing at least Bi2O3 upgrades electric performance and adhesion of formed electrode after firing. To the contrary, absence of either glass containing at least PbO or containing at least Bi2O3 degrades those performances. Given below is the content of glass containing at least PbO and glass containing at least $Bi_2O_3$ necessary for improving both resistance and adhesion. It is necessary for the content of glass containing at least PbO to be 20% or more, based on the total weight of the glass frit, because a content of less than 20% results in a greater series resistance. A content of 35% or more results in a lower series resistance. However, if the content of glass containing at least PbO is over 70%, the series resistance increases again, and a content more than 80% results in the series resistance exceeding the tolerance. The adhesive strength also becomes smaller than the tolerance when the content of glass containing at least PbO is more than 80%. On the other hand, when the content of glass containing at least $Bi_2O_3$ is less than 20%, there is an increase in series resistance and decrease in adhesive strength. A content of 20% or more results in series resistance lower than the tolerance and in adhesive strength exceeding the tolerance. A content of more than 30% results in the greatest decrease in series resistance. The adhesive strength exceeds the tolerance when the content of glass containing at least $Bi_2O_3$ is 20 wt %, and increases as the content increases at 20 wt % or more. In view of the above, the following is the content of glass containing at least PbO and glass containing at least $Bi_2O_3$ for improving both the series resistance and the adhesive strength. The minimum content of glass containing at least PbO is 20 wt %, and preferably 35 wt %. The maximum content of glass containing at least PbO is 80 wt %, and preferably 70 wt %. The minimum content of glass containing at least $Bi_2O_3$ is 20 wt %, and preferably 30 wt %. The maximum content of glass containing at least $Bi_2O_3$ is 80 wt % and preferably 65 wt %.

A feature of the present invention is that solar cell electrode properties are increased through the use of two or more kinds of glass having different compositions, as noted above. The advantages of using two or more kinds of glass are given below. The electrode properties obtained by firing the conductive paste change as a result of environmental conditions in the manufacturing process, the combination of other materials in the paste, as well as a variety of factors such as the type of substrate. Thus, even though the composition of the glass frit in the conductive paste significantly affects the electrode properties, it is difficult to find the optimal combination. However, rapid and flexible adjustment of the glass composition becomes possible when two kinds of glass frit having specific compositions for which the properties are understood, including a glass that contains PbO and a glass that contains $Bi_2O_3$, can be used in the conductive paste while varying the mixing proportions, as in the present invention noted above.

An average particle size of the glass frit (d50) in the range of 0.5-4.0 μm is preferred, and in the range of 0.7-3.0 μm more preferred. An average surface area of the glass frit (SA) in the range of 5.4-7.0 m2/g is preferred. The softening point of the glass frit (Ts: second transition point of DTA) is preferred to be in the range of 450-650° C. for glass containing at least PbO. For glass containing at least Bi2O3, the Ts is preferred to be in the range of 450-650° C. The amount of glass frit in the conductive paste is preferably in the range of 0.5 to 12 wt %, more preferably 1 to 5 wt % of the conductive paste. The glasses described herein are produced by conventional glass making techniques.

The glasses can be prepared in 500-1000 gram quantities. Typically, the ingredients are weighed then mixed in the desired proportions and heated in a bottom-loading furnace to form a melt in platinum alloy crucibles. As is well-known in the art, heating is conducted to a peak temperature of 1000° C.-1400° C. and for a time such that the melt becomes entirely liquid and homogeneous. The molten glass is quenched between counter rotating stainless steel rollers to form a 10-20 mil thick platelet of glass. The resulting glass platelet is then milled to form a powder with its 50% volume distribution set between 1-3 μm.

(3) Additives

The additional metal oxide of the present invention is preferably contained. The conductive paste of the present invention could preferably further contain a metal oxide of one or more of the metals selected from Zn, Ag, Gd, Ce, Zr, Ti, Mn, Sn, Ru, Co, Fe, Cu and Cr. The present invention of conductive paste contains more preferably ZnO as an additive. The present invention of conductive paste could contain more preferably $Ag_2O$ as an additive as well as ZnO. The particle size of the additional metal oxide additive is not subject to any particular limitation, although an average particle size of no more than 5 μm, and preferably no more than 2 μm, is desirable.

(4) Organic Medium

The inorganic components are typically mixed with an organic medium by mechanical mixing to form viscous compositions called "pastes", having suitable consistency and rheology for applying such as printing or coating. A wide variety of inert viscous materials can be used as organic medium. The organic medium is desired to be one in which the inorganic components are dispersible with an adequate degree of stability. The rheological properties of the medium is preferred to be such that they lend good application properties to the composition, including: stable dispersion of solids, appropriate viscosity and thixotropy for screen printing, appropriate wettability of the substrate and the paste solids, a good drying rate, and good firing properties. The organic medium used in the thick film composition of the present invention is preferably a nonaqueous inert liquid. Use can be made of any of various organic medium, which may or may not contain thickeners, stabilizers and/or other common additives. The organic medium is typically a solution of polymer(s) in solvent(s). Additionally, a small amount of additives, such as surfactants, may be a part of the organic medium. The most frequently used polymer for this purpose is ethyl cellulose. Other examples of polymers include ethylhydroxyethyl cellulose, wood rosin, mixtures of ethyl cellulose and phenolic resins, polymethacrylates of lower alcohols, and monobutyl ether of ethylene glycol monoacetate can also be used. The most widely used solvents found in thick film compositions are ester alcohols and terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. In addition, volatile liquids for promoting rapid hardening after application on the substrate can be included in the vehicle. Various combinations of these and other solvents are formulated to obtain the viscosity and volatility requirements desired. The polymer present is preferably in the range of 2 to 30 wt % of the organic medium. The solvent present is preferably in the range of 70 to 98 wt % of the organic medium. The ratio of organic medium in the thick film composition to the inorganic components in the dispersion is dependent on the method of applying the paste and the kind of organic medium used, and it can vary. Usually, the dispersion will contain 70-90 wt % of inorganic components and 10-30 wt % of organic medium in order to obtain good wetting.

Description of Method of Manufacturing a Solar Cell:

Accordingly, the invention provides a novel electrode that may be utilized in the manufacture of a solar cell. A p-type base solar cell which is one of the most typical types of solar cell is manufactured by the following method from a structural element composed of a junction-bearing semiconductor substrate and a silicon nitride insulating film formed on a main surface thereof. The method of manufacture of a solar cell includes the steps of applying (typically, coating and printing) onto the insulating film, in a predetermined shape and at a predetermined position, the conductive paste having the ability to penetrate the insulating film, then firing so that the conductive thick film composition melts and passes through the insulating film, effecting electrical contact with the silicon substrate. The electrode of this present invention is made of the conductive paste, as described herein, which is made of conductive powder and glass frit dispersed in an organic vehicle and optionally, additional metal/metal oxide additive(s).

The method of manufacture of the solar cell may also be characterized by manufacturing a semiconductor device from a structural element composed of a junction-bearing solar cell and an insulating film formed on one main surface thereof, wherein the insulating layer is selected from a titanium oxide silicon nitride, SiNx:H, silicon oxide, and silicon oxide/titanium oxide film, which method includes the steps of forming on the insulating film, in a predetermined shape and at a predetermined position, a metal paste material having the ability to react and penetrate the insulating film, forming electrical contact with the silicon substrate. The titanium oxide film is typically formed by coating a titanium-containing organic liquid material onto the semiconductor substrate and firing, or by a thermal CVD. The silicon nitride film is typically formed by PECVD (plasma enhanced chemical vapor deposition). The invention also provides a semiconductor device manufactured from this same method.

The electrode of this present invention formed from the conductive paste is typically fired in an atmosphere that is preferably composed of a mixed gas of oxygen and nitrogen. This firing process removes the organic medium and sinters the conductive powder with the glass frit in the conductive paste. The semiconductor substrate is typically single-crystal or multicrystalline silicon.

FIG. 1A shows a step in which a substrate of single-crystal silicon or of multicrystalline silicon is provided typically, with a textured surface which reduces light reflection. In the case of solar cells, substrates are often used as sliced from ingots which have been formed from pulling or casting processes. Substrate surface damage caused by tools such as a wire saw used for slicing and contamination from the wafer slicing step are typically removed by etching away about 10 to 20 μm of the substrate surface using an aqueous alkali solution such as aqueous potassium hydroxide or aqueous sodium hydroxide, or using a mixture of hydrofluoric acid and nitric acid. In addition, a step in which the substrate is washed with a mixture of hydrochloric acid and hydrogen peroxide may be added to remove heavy metals such as iron adhering to the substrate surface. An antireflective textured surface is sometimes formed thereafter using, for example, an aqueous alkali solution such as aqueous potassium hydroxide or aqueous sodium hydroxide. This gives the substrate, 10.

Figure 1B:
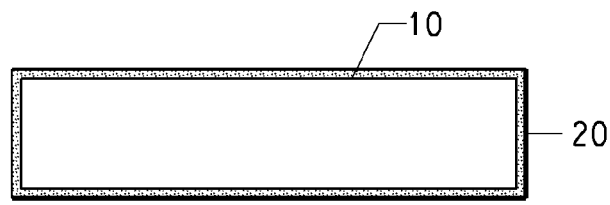
Figure 1C:

Next, referring to FIG. 1B, when the substrate used is a p-type substrate, an n-type layer is formed to create a p-n junction. The method used to form such an n-type layer may be phosphorus (P) diffusion using phosphorus oxychloride (POCl$_3$). The depth of the diffusion layer in this case can be varied by controlling the diffusion temperature and time, and is generally formed within a thickness range of about from 0.1 to 0.5 μm. Especially when the emitter junction depth is from 0.1 μm to 0.3 μm, it is called Shallow-emitter type Solar cell. The n-type layer formed in this way is represented in the diagram by reference numeral 20. Next, p-n separation on the front and backsides may be carried out by the method described in the background of the invention. These steps are not always necessary when a phosphorus-containing liquid coating material such as phosphosilicate glass (PSG) is applied onto only one surface of the substrate by a process, such as spin coating, and diffusion is effected by annealing under suitable conditions. Of course, where there is a risk of an n-type layer forming on the backside of the substrate as well, the degree of completeness can be increased by employing the steps detailed in the background of the invention.

Figure 1D:
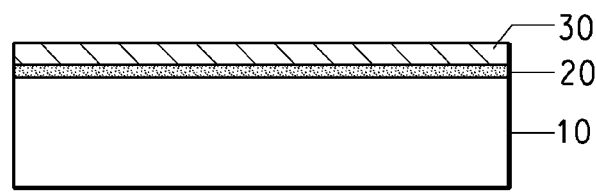

Next, in FIG. 1D, a silicon nitride film or other insulating films including SiNx:H (i.e., the insulating film comprises hydrogen for passivation during subsequent firing processing) film, titanium oxide film, and silicon oxide film, 30, which functions as an antireflection coating is formed on the above-described n-type diffusion layer, 20. This silicon nitride film, 30, lowers the surface reflectance of the solar cell to incident light, making it possible to greatly increase the electrical current generated. The thickness of the silicon nitride film, 30, depends on its refractive index, although a thickness of about 700 to 900 Å is suitable for a refractive index of about 1.9 to 2.0. This silicon nitride film may be formed by a process such as low-pressure CVD, plasma CVD, or thermal CVD. When thermal CVD is used, the starting materials are often dichlorosilane (SiCl$_2$H$_2$) and ammonia (NH$_3$) gas, and film formation is carried out at a temperature of at least 700° C. When thermal CVD is used, pyrolysis of the starting gases at the high temperature results in the presence of substantially no hydrogen in the silicon nitride film, giving a compositional ratio between the silicon and the nitrogen of Si$_3$N$_4$ which is substantially stoichiometric. The refractive index falls within a range of substantially 1.96 to 1.98. Hence, this type of silicon nitride film is a very dense film whose characteristics, such as thickness and refractive index, remain unchanged even when subjected to heat treatment in a later step. The starting gas used when film formation is carried out by plasma CVD is generally a gas mixture of SiH$_4$ and NH$_3$. The starting gas is decomposed by the plasma, and film formation is carried out at a temperature of 300 to 550° C. Because film formation by such a plasma CVD process is carried out at a lower temperature than thermal CVD, the hydrogen in the starting gas is present as well in the resulting silicon nitride film. Also, because gas decomposition is effected by a plasma, another distinctive feature of this process is the ability to greatly vary the compositional ratio between the silicon and nitrogen. Specifically, by varying such conditions as the flow rate ratio of the starting gases and the pressure and temperature during film formation, silicon nitride films can be formed at varying compositional ratios between silicon, nitrogen and hydrogen, and within a refractive index range of 1.8 to 2.5. When a film having such properties is heat-treated in a subsequent step, the refractive index may change before and after film formation due to such effects as hydrogen elimination in the electrode firing step. In such cases, the silicon nitride film required in a solar cell can be obtained by selecting the film-forming conditions after first taking into account the changes in film qualities that will occur as a result of heat treatment in the subsequent step.

In FIG. 1D, a titanium oxide film may be formed on the n-type diffusion layer, 20, instead of the silicon nitride film, 30, functioning as an antireflection coating. The titanium oxide film is formed by coating a titanium-containing organic liquid material onto the n-type diffusion layer, 20, and firing, or by thermal CVD. It is also possible, in FIG. 1D, to form a silicon oxide film on the n-type diffusion layer, 20, instead of the silicon nitride film 30 functioning as an antireflection layer. The silicon oxide film is formed by thermal oxidation, thermal CVD or plasma CVD.

Figure 1E:
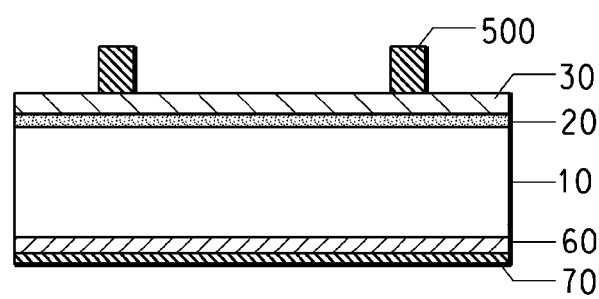
Figure 1F:
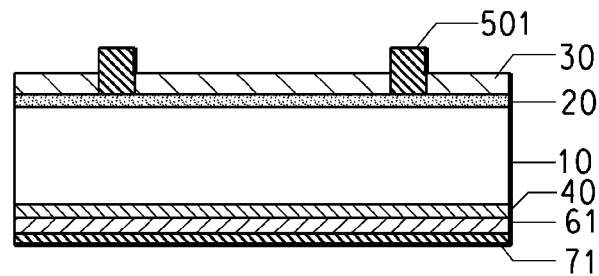

Next, electrodes are formed by steps similar to those shown in FIG. 1E and FIG. 1F. That is, as shown in FIG. 1E, aluminum paste, 60, and back side silver paste, 70, are screen printed onto the back side of the substrate, 10, as shown in FIG. 1E and successively dried. In addition, a front electrode-forming conductive paste is screen printed onto the silicon nitride film, 30, in the same way as on the back side of the substrate, 10, following which drying and firing are carried out in an infrared furnace at typically at a set point temperature range of 700 to 975° C. for a period of from one minute to more than ten minutes while passing through the furnace a mixed gas stream of oxygen and nitrogen.

As shown in FIG. 1F, during firing, aluminum diffuses as an impurity from the aluminum paste into the silicon substrate, 10, on the back side, thereby forming a p+ layer, 40, containing a high aluminum dopant concentration. Firing converts the dried aluminum paste, 60, to an aluminum back electrode, 61. The backside silver paste, 70, is fired at the same time, becoming a silver back electrode, 71. During firing, the boundary between the backside aluminum and the backside silver assumes the state of an alloy, thereby achieving electrical connection. Most areas of the back electrode are occupied by the aluminum electrode, partly on account of the need to form a p+ layer, 40. At the same time, because soldering to an aluminum electrode is impossible, the silver or silver/aluminum back electrode is formed on limited areas of the backside as an electrode for interconnecting solar cells by means of copper ribbon or the like.

On the front side, the front electrode, 500, is made of the conductive paste of the present invention which is composed of conductive, glass frit, organic medium and optional metal oxides, and is capable of reacting and penetrating through the silicon nitride film, 30, during firing to achieve electrical contact with the n-type layer, 20 (fire through). This fired-through state, i.e., the extent to which the conductive paste on the front melts and passes through the silicon nitride film, 30, depends on the quality and thickness of the silicon nitride film, 30, the composition of the front electrode, and on the firing conditions. The conversion efficiency and moisture resistance reliability of the solar cell clearly depend, to a large degree, on this fired-through state.

A conductive paste for solar cell electrode of this present invention can be used on not only p-type base solar cell but also any type of silicon solar cell such as n-type base solar cell or back contact type of solar cell.

EXAMPLES

Examples of the electrode of the present invention is described herein below.
(A) Conductive Paste Preparation
Used material in the paste preparation and the content of each component are as follows.
i) Electrically functional conductive powder: A mixture of 24% of spherical silver powder [d50 2.3 µm as determined with a laser scattering-type particle size distribution measuring apparatus] and 56% of flake silver powder [d50 2.9 µm] were used. The total content of the silver powder was 80 wt % of the conductive paste.
ii) Glass Frit: The two sort of glass frits which were glass containing at least PbO and glass containing at least Bi2O3 were mixed in the conductive paste by different proportion as shown in table 1. The content of the total glass frits was 2 wt % of the conductive paste. Glass containing at least PbO further contained 28.0 wt % of $SiO_2$, 4.7 wt % of $Al_2O_3$, 8.1 wt % of $B_2O_3$, glass containing at least $Bi_2O_3$ further contained 22.0 wt % of $SiO_2$, 0.3 wt % of $Al_2O_3$, 3.8 wt % of $B_2O_3$. Four different glass frit with different proportion of the each glass frit as shown in table 1 were prepared.
iii) Organic Medium: An organic medium consisting of mainly Ethyl cellulose resin and texanol was used. The content of the organic medium was 10 wt % of the conductive paste.
iv) Additive: every conductive paste contained 6 wt % of ZnO as an additive.

Paste preparations were, in general, accomplished with the following procedure: The appropriate amount of solvent and the organic medium described above were weighed then mixed in a mixing can for 15 minutes, then silver powder and glass frits described above and ZnO as a metal additive were added and mixed for another 5 minutes. When well mixed, the paste was repeatedly passed through a 3-roll mill for at progressively increasing pressures from 0 to 400 psi. The gap of the rolls was adjusted to 1 mil. The degree of dispersion was measured by fineness of grind (FOG). A typical FOG value is generally equal to or less than 20/10 for conductors. 4 kinds of paste which had different proportion of the glass frit as shown in Table 1 were prepared.

(B) Method of Electrode Production
Solar cells were formed by using the four kinds of conductive paste described in (A) above. Firstly, silicon (Si) wafers (p-doped base and n-doped emitter with SiNx antireflection coatings) were prepared. The size of the Si wafers were 38 mm square and 0.2 mm thickness. Aluminum paste (PV322, E.I. Dupont de Nemours and Company) were screen printed on the back side of these Si wafers and then dried at the temperature of 150° C. for 5 minutes. The printed pattern of aluminum paste was 34 mm×34 mm square and 30 µm thickness after drying. The Ag paste was printed on front side of the Si wafer to form electrode pattern with a bus bar and fourteen finger lines at both side of the bus bar. The wafers with printed pattern were dried under 150° C. for 5 min. The dried pattern was fired in an IR heating belt furnace in air. The maximum set temperature was 895° C. and its In-Out time was 120 sec. The bus bar had 2 mm width and 15 µm thickness, and the finger lines had 150 µm width and 15 µm thickness after firing.

(C) Test Procedure Series Resistance
The electrical characteristics of series resistance (Rs, Ω) of the electrodes were evaluated with a solar cell tester, Model NCT-M-150AA, NPC Co., Ltd. The results of this electrical testing are presented in Table 1.

(D) Test Procedure Adhesion
The adhesion (Ad, N) of the electrodes were measured by the following procedures. The fired structures of the pastes were prepared by the same way as above. The back side of the Si wafer with electrode were glued on an alumni substrate. Then aliquots of no-clean soldering flux were placed on the bus-bar pattern of the fired paste. A tinned-copper ribbon (typically Sn/Pb) is placed over the bus-bar and the samples were soldered. The typical soldering condition was as follows.
Preheat temperature and time: 116° C., 20 sec
Solder iron setting temperature and pressure: 450° C., 0.15 MPa
Soldering time: 15 sec
After the soldering completed, an unattached part of the ribbon was bent at right angles. The ribbon was pulled vertically at a rate of 12 mm/min by a machine (RCT-500N-AF, Toyo seiki Co., Ltd.) and the force was recorded until the ribbon detached. The maximum force was recorded as the adhesion strength for each sample. The results of this adhesion testing are presented in Table 1.

(D) Results

Figure 2:
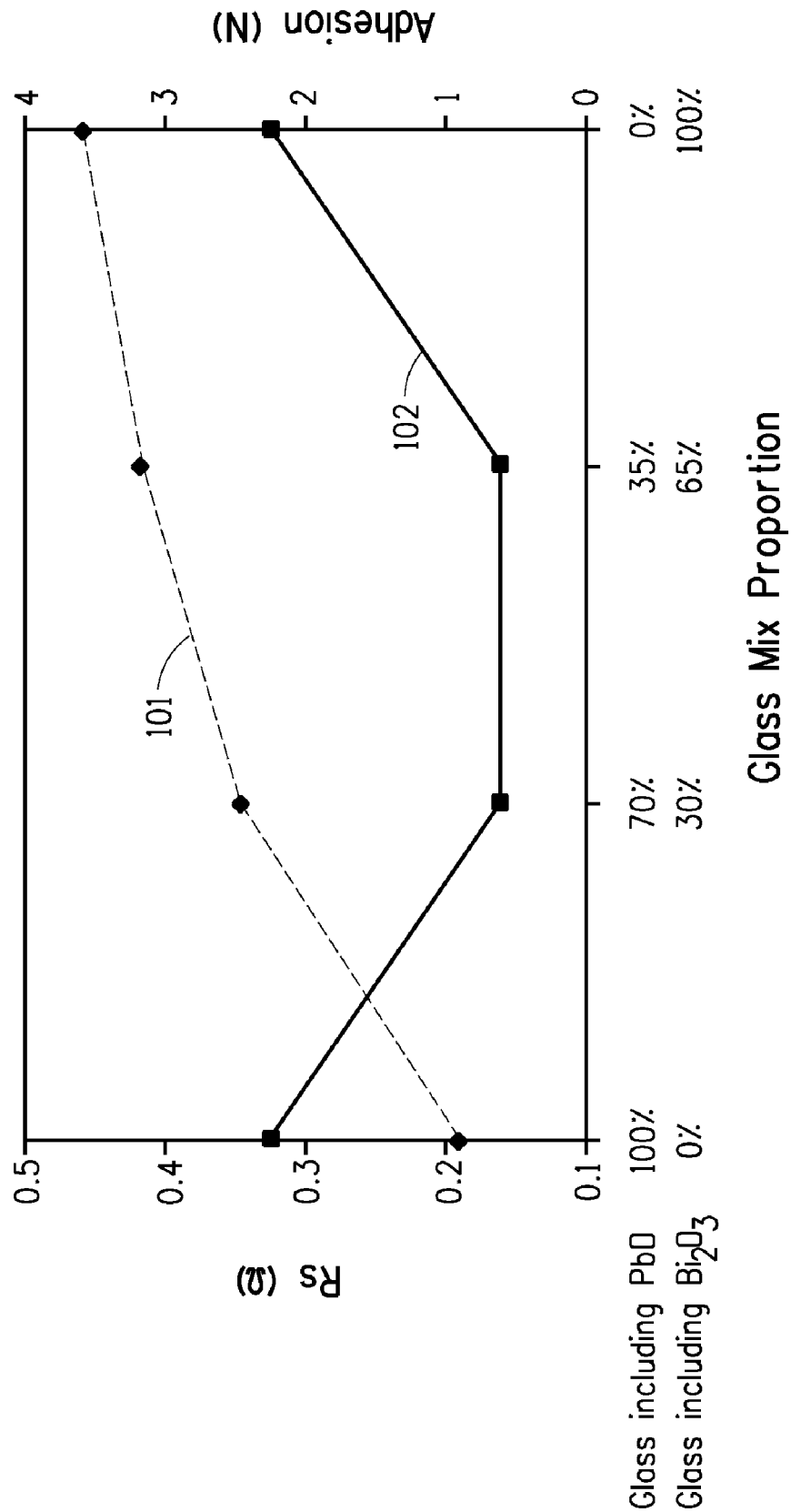
FIG. 2 shows relasionship between glass containing at least PbO and glass containing at least $Bi_2O_3$ amounts, serial resistance ($R_S$) and adhesion (Ad).

The Rs and adhesion data are shown in Table 1 and FIG. 2. Examples 1 and 2 showed superior value in both of adhesion 101 and resistance 102 and provided better overall property of a solar cell. Both Rs and Ad were improved when glass containing at least PbO was 70 wt % and glass containing at least $Bi_2O_3$ was 30 wt %, and glass containing at least PbO was 35 wt % and glass containing at least $Bi_2O_3$ was 65 wt %. According to FIG. 2, both the adhesion 101 higher than 2.0 N and Rs 102 lower than 0.25 ohm which were acceptable for a practical solar cell use can be simultaneously obtained by the conductive paste that has both of glass containing at least PbO and glass containing at least Bi2O3 with the proportion of from 20% and 80% to 80% and 20%. By reducing Rs and Ad of the electrode, the efficiency which indicates how much solar power is converted to electricity has increased with acceptable mechanical strength, resulting in the superior performance of formed solar cell.

TABLE 1

| | Comparison 1 | Comparison 2 | Example 1 | Example 2 |
|---|---|---|---|---|
| Glass including PbO (wt %) | 100 | 0 | 70 | 35 |
| Glass including $Bi_2O_3$ glass (wt %) | 0 | 100 | 30 | 65 |
| Rs (Ω) | 0.31 | 0.23 | 0.16 | 0.16 |
| Ad (N) | 0.89 | 3.57 | 2.42 | 3.24 |

The invention claimed is:

1. A method for producing a solar cell electrode comprising steps of:
    preparing a p-type silicon substrate having a front side and a back side, wherein a n-type diffusion layer and an anti-reflection coating is formed on the front side of the p-type silicon substrate in this order;
    applying a conductive paste on the anti-reflection coating, wherein the conductive paste comprises conductive powder, organic medium, a first glass frit comprising at least PbO and a second glass frit comprising at least $Bi_2O_3$, wherein the first glass frit is 20-80 wt % based on the total weight of the first glass frit and the second glass frit; and
    firing the applied conductive paste.

2. A method for producing a solar cell electrode according to claim 1, wherein the conductive paste is fired at between 700 to 975° C.

3. A method for producing a solar cell electrode according to claim 1, wherein both the first glass frit and the second glass frit comprise one or more of $SiO_2$, $Al_2O_3$ and $B_2O_3$.

4. A method for producing a solar cell electrode according to claim 1, wherein the total content of $SiO_2$, $Al_2O_3$ and $B_2O$ in the first glass frit is 11 to 70 wt % and the total content of $SiO_2$, $Al_2O_3$ and $B_2O$ in the second glass frit is 11 to 70 wt %.

5. A method for producing a solar cell electrode according to claim 1, wherein the total amount of the first glass frit and the second glass frit is from 0.5 to 12.0 wt % of the conductive paste.

6. A method for producing a solar cell electrode according to claim 1, wherein the conductive powder comprises Ag or mixture of Ag and at least one metal selected from the group consisting of Pd, Ir, Cu, Ni, Al, Au, Su, Zn, Pt, Ru, Ti, and Co.

7. A method for producing a solar cell electrode according to claim 1, wherein the conductive paste comprises metal oxides comprising one or more of metal selected from the group consisting of Zn, Ag, Gd, Ce, Zr, Ti, Mn, Sn, Ru, Co, Fe, Cu and Cr.

8. A method for producing a solar cell electrode according to claim 1, wherein the silicon wafer has emitter junction depth which is from 0.1 to 0.5 μm.

\* \* \* \* \*